US006801091B2

(12) United States Patent
Atsumi et al.

(10) Patent No.: US 6,801,091 B2
(45) Date of Patent: Oct. 5, 2004

(54) OSCILLATOR CONTROLLER AND ATOMIC OSCILLATOR

(75) Inventors: Ken Atsumi, Hokkaido (JP); Hideyuki Matsuura, Hokkaido (JP); Yoshifumi Nakajima, Hokkaido (JP); Yoshito Koyama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 150 days.

(21) Appl. No.: 10/315,738

(22) Filed: Dec. 10, 2002

(65) Prior Publication Data

US 2003/0146797 A1 Aug. 7, 2003

(30) Foreign Application Priority Data

Feb. 7, 2002 (JP) ....................................... 2002-030556

(51) Int. Cl.[7] .................................................. H03L 7/26
(52) U.S. Cl. .......................................................... 331/3
(58) Field of Search .................................... 331/3, 94.1

(56) References Cited

U.S. PATENT DOCUMENTS 6,130,583 A * 10/2000 Stern et al. .................... 331/3

FOREIGN PATENT DOCUMENTS

WO WO 96/20535 7/1996

* cited by examiner

*Primary Examiner*—David Mis
(74) *Attorney, Agent, or Firm*—Katten Muchin Zavis Rosenman

(57) ABSTRACT

An oscillator controller which optimizes key circuit parameters of an excitation circuit according to the operating condition of a discharge lamp. An excitation circuit energizes a discharge lamp to produce a light beam for pumping atoms, as part of a mechanism of atomic resonance detection. The operation of the excitation circuit is monitored by a start-up voltage monitor, which asserts a voltage monitoring signal when the excitation circuit's start-up voltage is reached. A light amount monitor receives a resonance detection signal from a light sensing device to check the amount of light before and after the discharge lamp lights up. The resultant light amount monitoring signal indicates this information. Based on the two monitoring signals, a bias voltage selector selects an appropriate bias voltage that varies circuit parameters of the excitation circuit.

14 Claims, 15 Drawing Sheets

T BIAS VOLTAGE SELECTION TABLE

| VOLTAGE MONITORING SIGNAL | LIGHT AMOUNT MONITORING SIGNAL | SW1 | SW2 | SW3 | BIAS VOLTAGE |
|---|---|---|---|---|---|
| L | L | ON | OFF | OFF | Vc1 |
| H | L | OFF | ON | OFF | Vc2 |
| H | H | OFF | OFF | ON | Vc3 |

FIG. 6

OSCILLATOR CONTROLLER AND ATOMIC OSCILLATOR

BACKGROUND OF THE INVENTION

1. Field of the Invention

The present invention relates to an oscillator controller and an atomic oscillator using the same. More particularly, the present invention relates to an oscillator controller for use in an atomic oscillator, as well as to an atomic oscillator whose resonance frequency derives from atomic transitions.

2. Description of the Related Art

Rubidium atomic oscillators produce a constant frequency output by utilizing atomic transitions of rubidium, the resonance frequency of which is highly stable. Because of their extremely high frequency stability, rubidium oscillators are widely used as a high-accuracy timing source for communications networks and also as a frequency standard for television broadcast services.

In rubidium oscillators, rubidium atoms in a resonance cell is pumped with lights that emanate from a rubidium discharge lamp integrated therein. FIG. 12 shows the structure of a conventional excitation circuit for energizing a discharge lamp. This circuit is composed of discrete devices connected as follows. The collector of a transistor Tr is wired to a voltage Vin, together with one end of a resistor R1. Its base is connected with the other end of the resistor R1, the anode of a diode D1, and one end of a capacitor C1, and one end of a capacitor C3. Its emitter is connected to the other end of the capacitor C1, one end of a capacitor C2, and one end of a resistor R2. The other end of the diode D1 is grounded, and so are the other ends of the capacitor C2 and resistor R2. A coil L is connected in series with the capacitor C3, with its remaining end grounded.

The coil L acts as one of the resonant elements of the above-described excitation circuit. It is wound around a piece of glassware, called a cell, in which rubidium gasses are encapsulated. This device is referred to as a rubidium lamp Lp, and the excitation circuit supplies a high-frequency current (e.g., several tens to one hundred MHz) to the surrounding coil L, causing a discharge in the rubidium lamp Lp. This produces a light, which will be referred to hereafter as "rubidium lamp light." The excitation circuit should control its output adaptively in accordance with the conditions of the rubidium lamp Lp. In addition, the input voltage (Vin) of the excitation circuit has to be kept as low as possible, in order to reduce the power consumption of the circuit and increase the longevity.

We have to consider some critical voltages regarding Vin, which are: start-up voltage of the excitation circuit, and turn-on and turn-off voltages of the rubidium lamp. FIGS. 13 to 15 show the relationship between those voltages and the values of capacitors used in the excitation circuit. Their horizontal axis represents the capacitor values C1 to C3. The vertical axis of FIG. 13 represents the start-up voltage, at which the excitation circuit starts to oscillate (i.e., starts to energize the rubidium lamp Lp). The vertical axis of FIG. 14 represents the turn-on voltage, at which the oscillation of the excitation circuit is strong enough for the rubidium lamp Lp to light up. The vertical axis of FIG. 15 represents the turn-off voltage, at which the rubidium lamp Lp goes out.

The curve W1 of FIG. 13 indicates a positive correlation between the capacitor value C1 and start-up voltage. This means that a smaller capacitance should be chosen for the capacitor C1 when we wish to reduce the start-up voltage.

The curve W1*a* of FIG. 14, on the other hand, shows a negative correlation between the capacitor value C1 and turn-on voltage. This suggests to us that a larger capacitance should be chosen for the capacitor C1 when we wish to reduce the turn-on voltage.

As seen from the above explanation, there are tradeoffs between some desirable circuit characteristics, and accordingly, we have to make a compromise when deciding circuit parameters including the capacitor values C1 to C3. Think of, for example, prioritizing the reduction of start-up voltage, and select a smaller capacitance for C1 according to that policy. This choice of C1, however, results in a higher turn-on voltage and a raised turn-off voltage, which are both undesirable because it would then be more likely that the ridium lamp Lp would never turn on or might go out during the operation. Such troubles could happen after years of service, and it would be fatal if it did happen.

We may adopt another policy, giving up the benefit of low turn-on voltages. This means, however, that we have to provide a separate high-voltage pulse generator to trigger the rubidium lamp Lp, which needs several thousands to several tens of thousands of volts to start up. This pulse generator requires bulky components such as a trigger transformer, converter transformer, and charging capacitor with a large capacitance. It is therefore difficult to implement such an additional circuit in a small rubidium oscillator available in recent years.

SUMMARY OF THE INVENTION

In view of the foregoing, it is an object of the present invention to provide an oscillator controller which optimizes key circuit parameters of an excitation circuit according to the operating condition of a discharge lamp.

It is another object of the present invention to provide a highly accurate and reliable atomic oscillator which optimizes key circuit parameters of an excitation circuit according to the operating condition of a discharge lamp.

To accomplish the first object, the present invention provides an oscillator controller for use in an atomic oscillator. This oscillator controller comprises the following elements: (a) an excitation circuit having a discharge lamp, which produces a light beam by energizing the discharge lamp, the light beam being for use in pumping atoms; and (b) a circuit parameter optimizer which controls at least one circuit parameter of the excitation circuit for optimal operation thereof, comprising: a start-up voltage monitor which detects whether a start-up voltage of the excitation circuit is reached, thus producing a voltage monitoring signal; a light amount monitor which receives a resonance detection signal to check the amount of light before and after the rubidium lamp lights up, thus producing a light amount monitoring signal; and a bias voltage selector which selects a bias voltage for use in the excitation circuit, based on the voltage monitoring signal and light amount monitoring signal.

To accomplish the second object, the present invention provides an atomic oscillator whose resonance frequency derives from atomic transitions. This atomic oscillator comprises the following elements: (a) a voltage-controlled oscillator which produces an oscillation signal according to a given control voltage; (b) a frequency synthesizer which produces microwaves from the oscillation signal by modulating the oscillation signal with a low-frequency signal and upconverting the oscillation signal with frequency synthesis techniques; (c) an atomic resonator, comprising: (c1) an excitation circuit having a discharge lamp, which produces a light beam by energizing the discharge lamp, the light beam being for use in pumping atoms, (c2) a circuit parameter optimizer which controls at least one circuit parameter of the excitation circuit for optimal operation thereof, comprising: a start-up voltage monitor which detects whether the excitation circuit has reached a start-up voltage thereof, thus producing a voltage monitoring signal; a light amount monitor which receives a resonance detection signal to check the amount of light before and after the rubidium lamp lights up, thus producing a light amount monitoring signal; and a bias voltage selector which selects a bias voltage for use in the excitation circuit, based on the voltage monitoring signal and light amount monitoring signal, and (c3) a resonance detection unit which produces a resonance detection signal by detecting the amount of the light beam having passed through the atoms, the amount varying in accordance with the difference between the frequency of the microwaves and the resonance frequency of the atoms; and (d) a servo circuit which produces and supplies the low-frequency signal to the frequency synthesizer, as well as produces the control voltage for the voltage-controlled oscillator by demodulating the resonance detection signal synchronously with the low-frequency signal.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 6 shows a bias voltage selection table;

DESCRIPTION OF THE PREFERRED EMBODIMENTS

Figure 1:
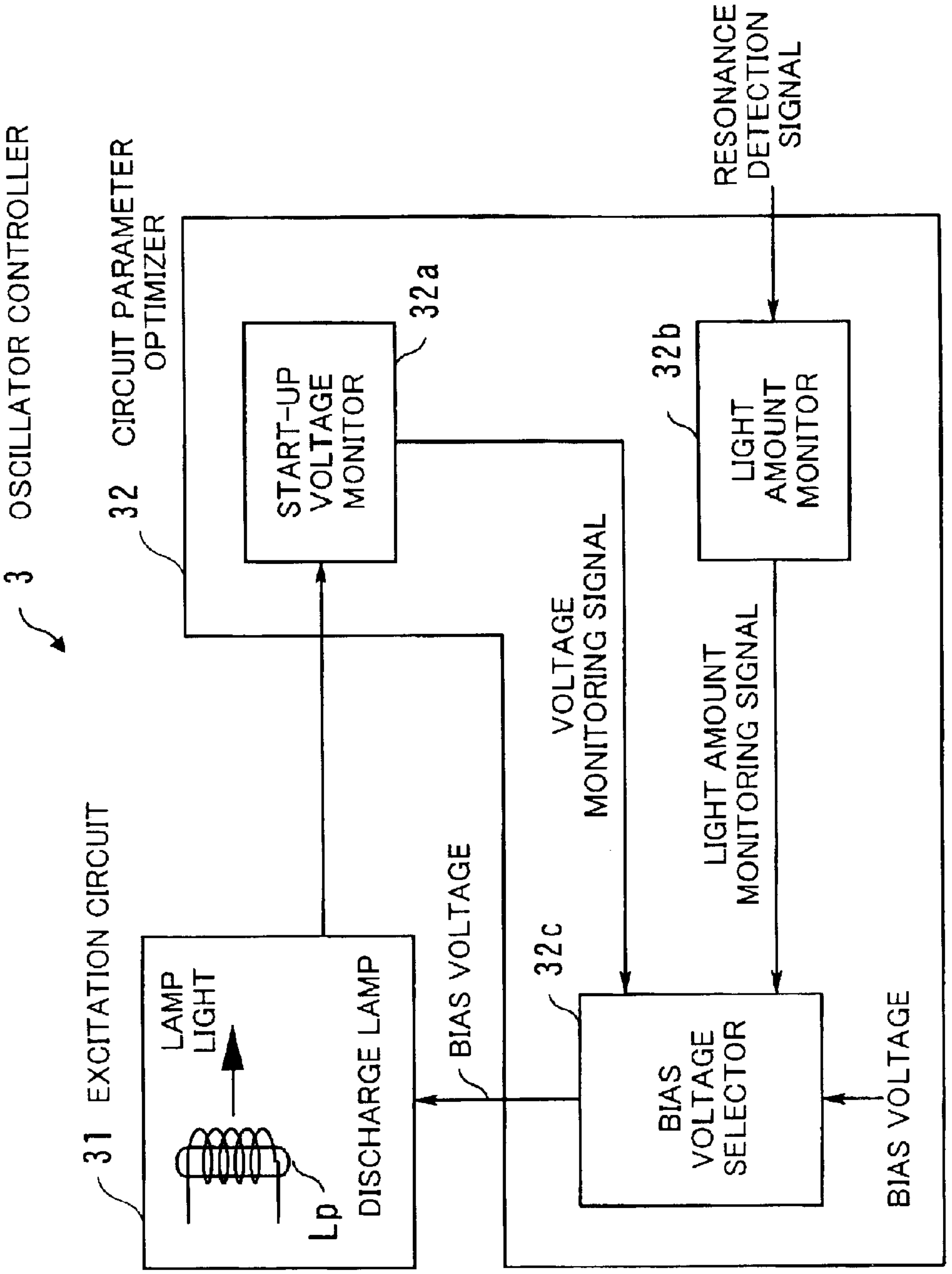
FIG. 1 is a conceptual view of an oscillator according to the present invention.

Preferred embodiments of the present invention will be described below with reference to the accompanying drawings, wherein like reference numerals refer to like elements throughout.

FIG. 1 is a conceptual view of an oscillator according to the present invention. The illustrated oscillator controller 3 is a device for controlling an atomic oscillator whose resonance frequency is based on atomic transitions (particularly, of rubidium atoms). This oscillator controller 3 comprises an excitation circuit 31 and a circuit parameter optimizer 32.

The excitation circuit 31 energizes a discharge lamp Lp to produce a light beam for pumping rubidium atoms, as part of a mechanism of rubidium resonance detection (described later). Having mentioned this specific kind of atom, we will hereafter refer to the discharge lamp Lp as "rubidium lamp Lp." The circuit parameter optimizer 32 varies some circuit parameters of the excitation circuit 31 for the purpose of optimal operation. More specifically, the term "circuit parameters" refers to the values of some capacitors in the excitation circuit 31 which govern the operating characteristics of the rubidium lamp Lp. To this end, the circuit parameter optimizer 32 has a start-up voltage monitor 32*a*, a light amount monitor 32*b*, and a bias voltage selector 32*c*.

The start-up voltage monitor 32*a* observes the operation of the excitation circuit 31 to detect whether its start-up voltage is reached, producing a voltage monitoring signal to indicate it. The light amount monitor 32*b* receives a resonance detection signal (described later) to check the amount of light before and after the rubidium lamp Lp lights up, producing a light amount monitoring signal to indicate it. Based on the voltage monitoring signal and light amount monitoring signal, the bias voltage selector 32*c* chooses an appropriate bias voltage for use in the excitation circuit 31. We will discuss the operation of those components in more detail later.

Figure 2:
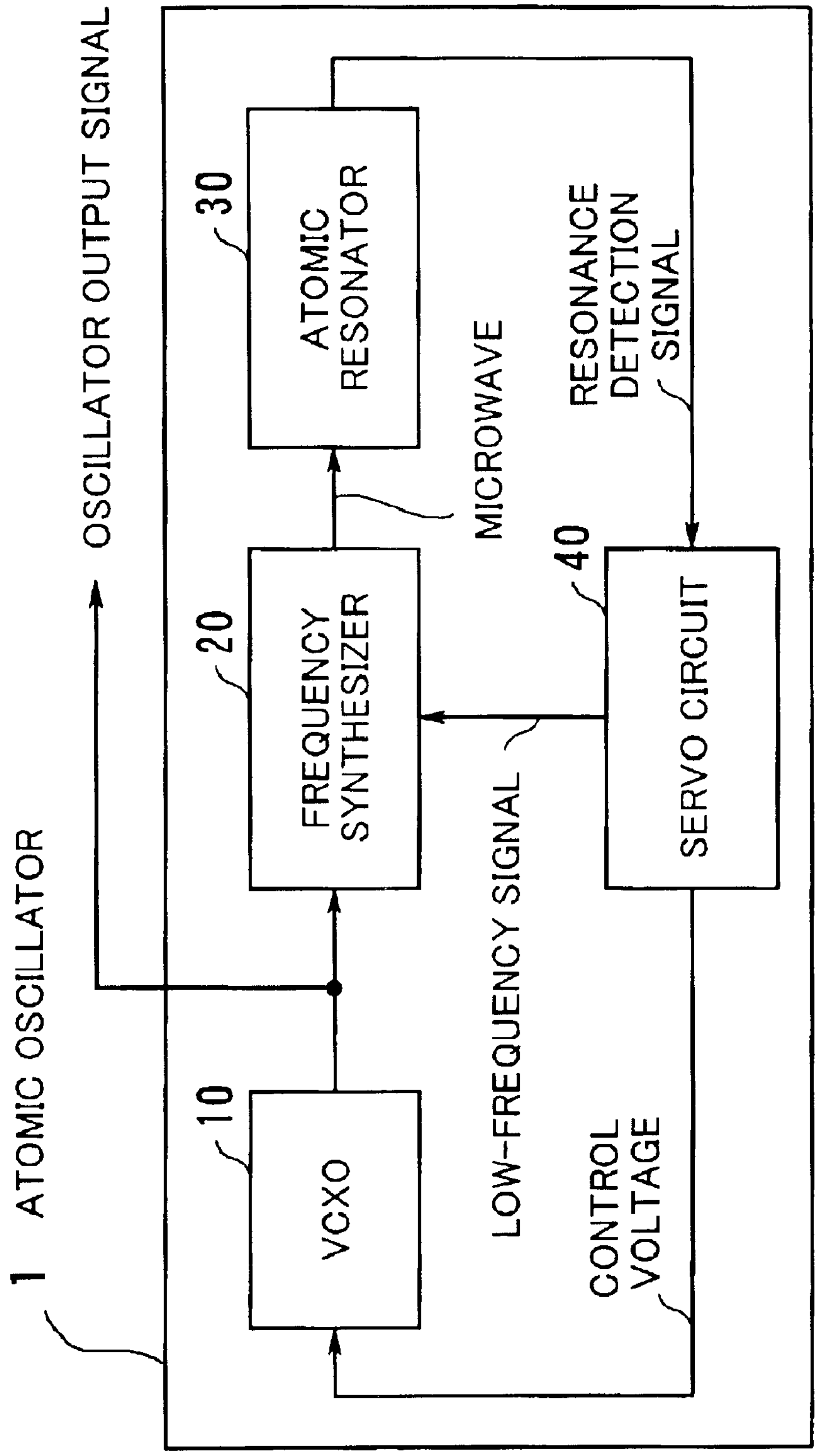
FIG. 2 shows the structure of an atomic oscillator.

The proposed oscillator controller 3 is an integral part of an atomic oscillator. Specifically, FIG. 2 shows the structure of such an atomic oscillator 1, which produces a standard clock signal for broadcast networks, synchronous digital networks, mobile networks, and other wide-area communications infrastructures. This atomic oscillator 1 comprises a voltage-controlled oscillator 10, a frequency synthesizer 20, an atomic resonator 30, and a servo circuit 40. As seen from FIG. 2, these components form a feedback control system which locks in the oscillator output to the exact resonance frequency of rubidium.

The voltage-controlled crystal oscillator (VCXO) 10 is an electrically tunable oscillator whose output frequency is determined by an external control voltage, which is provided from the servo circuit 40. The oscillation signal is available for external use, as well as being supplied to the frequency synthesizer 20 as part of the servo loop.

The frequency synthesizer 20 produces a microwave signal by upconverting the VCXO oscillation signal, while modulating its phase with a low-frequency signal supplied from the servo circuit 40. This frequency synthesis process includes frequency multiplication operations. The output frequency of the frequency synthesizer 20 is about 6.83468 GHz, the resonance frequency (natural frequency) of rubidium, if the VCXO 10 has its nominal frequency.

The produced microwave signal is then supplied to the atomic resonator 30, which outputs a resonance detection signal as will be described later in FIG. 3. The servo circuit 40 produces the above-mentioned low-frequency signal for modulation of the microwave output of the frequency synthesizer 20. This low-frequency signal is then used again to detect frequency errors in the oscillator output, which is accomplished by processing the received resonance detection signal with synchronous demodulation techniques. The detected error signal is supplied to the VCXO 10 as its control voltage.

Figure 3:
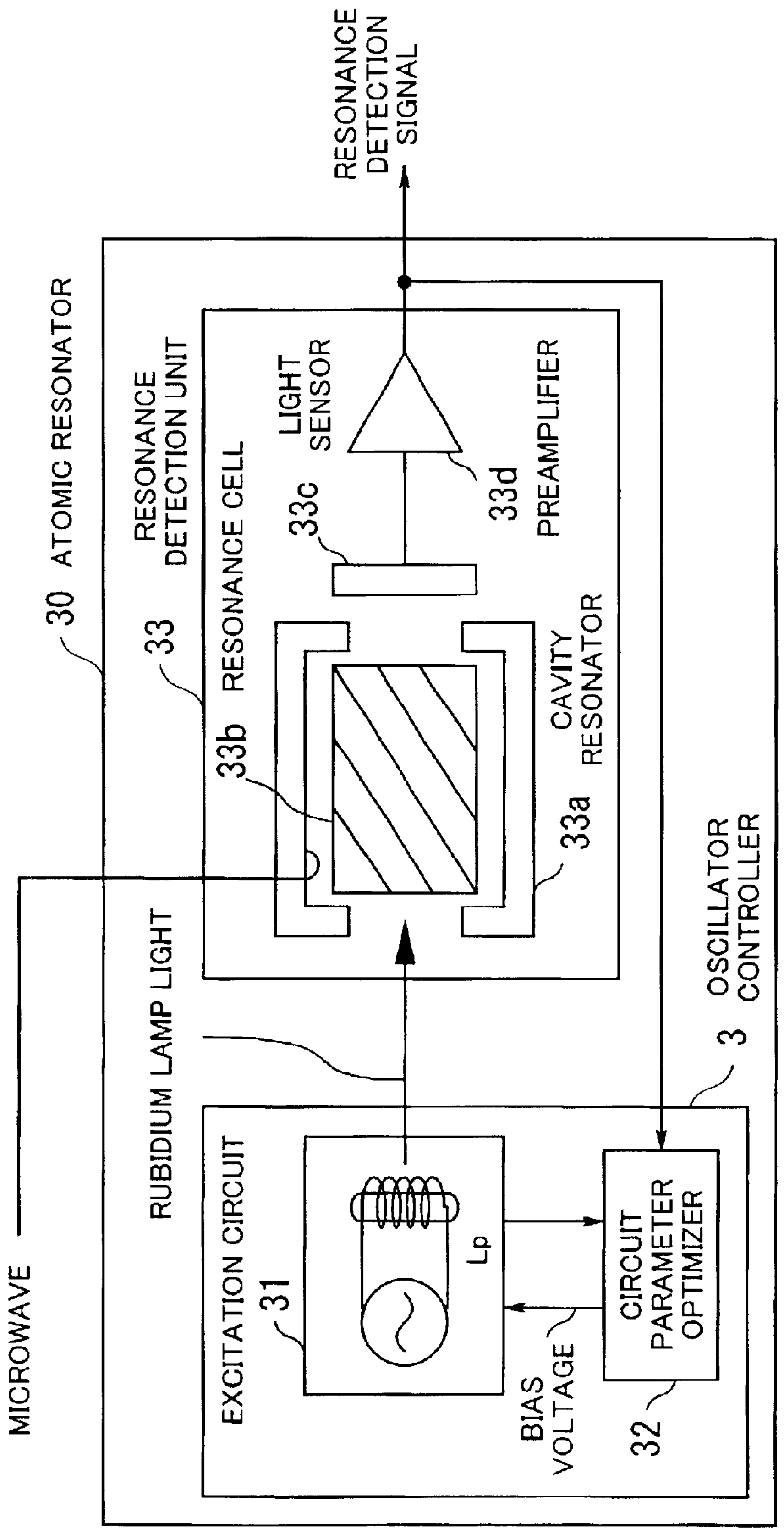
FIG. 3 shows the structure of an atomic resonator.

FIG. 3 shows the structure of the atomic resonator 30. As seen, the oscillator controller 3 explained earlier in FIG. 1 is integrated as part of this atomic resonator 30. Also included is a resonance detection unit 33, which is composed of a cavity resonator 33*a*, a resonance cell 33*b*, a light sensor 33*c* (photodiode), and a preamplifier 33*d*.

The atomic resonator 30 plays a central role in the feedback control system of the atomic oscillator 1 as follows. The microwaves produced by the frequency synthesizer 20 (FIG. 2) are directed to the cavity resonator 33*a* in the atomic resonator 30, which is tuned to the resonance frequency of rubidium, 6.83468 GHz. The cavity resonator 33*a* accommodates a resonance cell 33*b* filled with rubidium vapor. Rubidium lamp light produced by the excitation circuit 31 passes through the rubidium vapor in the resonance cell 33*b* and reaches the light sensor 33*c*, where the amount of the light is measured.

When the applied microwave frequency agrees with rubidium's resonance frequency, the light sensor 33*c* observes a drop in the amount of the incoming rubidium lamp light, because the light is absorbed as a result of atomic resonance caused by the microwave field in the resonance cell cavity. Thus the light sensor 33*c* exhibits the lowest output level in this exactly matched condition.

Since the microwaves are phase-modulated with a low-frequency signal, as mentioned earlier, the output of the light sensor 33*c* will contain some AC signal components. Again, the maximum drop is observed when the microwave frequency is exactly equal to the rubidium resonance frequency. When the light sensor 33*c* indicates a deviation from the maximum drop, it means a positive or negative error of the modulated microwave frequency from the exact natural frequency of rubidium atom. The sensor output actually exhibits such errors that are 180-degree out of phase in the vicinity of the atomic resonance frequency of rubidium.

The light sensor 33*c* detects the rubidium lamp light in the way described above, and its output, including AC error components, is then amplified by a preamplifier 33*d* for use as a resonance detection signal in the later stage. The servo circuit 40 converts this resonance detection signal into a DC control voltage for the VCXO 10, by demodulating it synchronously with the low-frequency signal that is used to phase-modulate the microwaves. Besides being used to regulate the output frequency of the VCXO 10, the control voltage is also supplied to the oscillator controller 3 for the purpose of monitoring the amount of light (described later).

Figure 4:
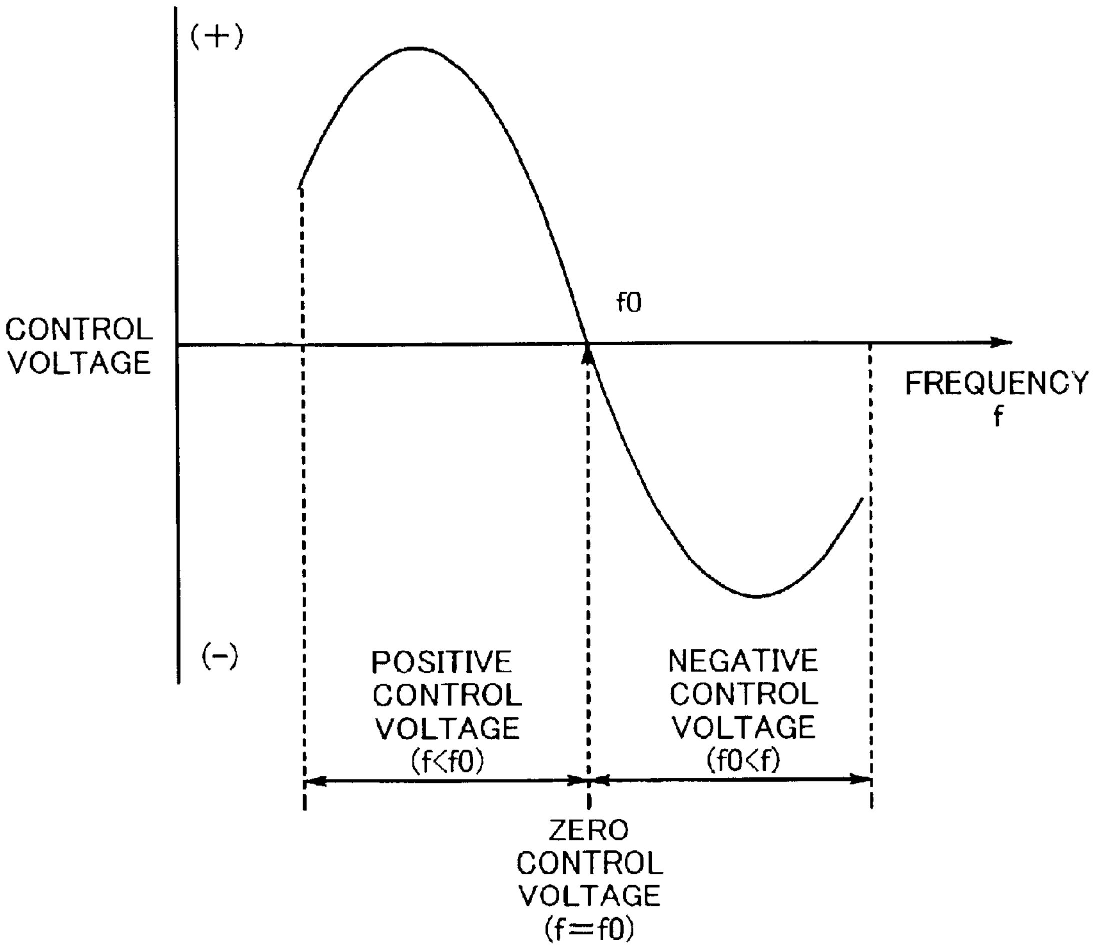
FIG. 4 shows the relationship between frequency deviation and control voltage.

FIG. 4 represents the relationship between the frequency error and VCXO control voltage, where f denotes the microwave frequency, and f0 is the rubidium resonance frequency f0. When f<f0, a positive control voltage is produced. When f=f0, the control voltage becomes zero. When f0<f, a negative control voltage is produced. The VCXO 10 is controlled with such a command signal, so that the crystal oscillator output will stay at the frequency f0 with the same stability as that of the rubidium resonance frequency.

Figure 5:
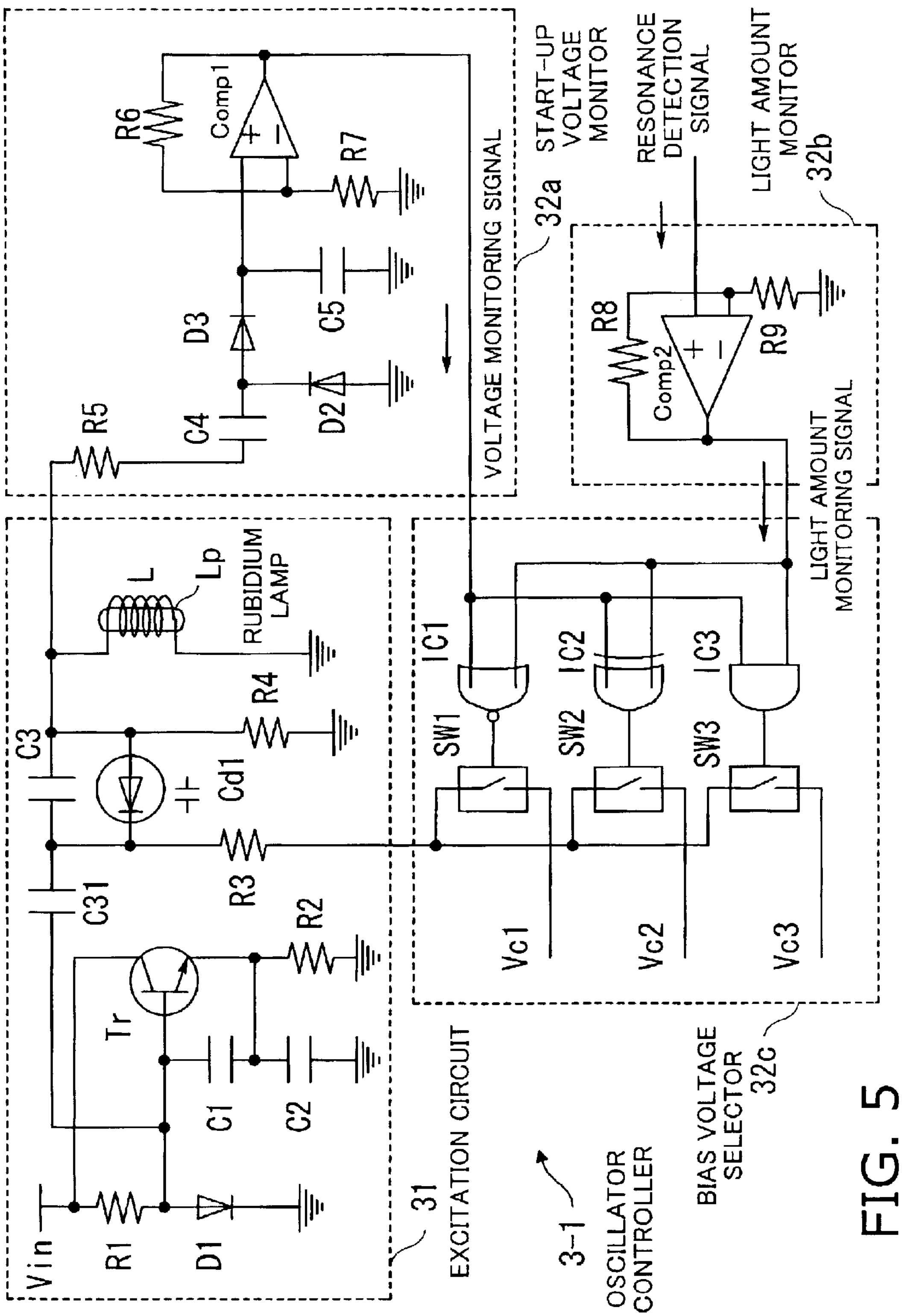
FIG. 5 shows the structure of an oscillator controller according to a first embodiment of the present invention.

A more specific configuration and operation of the above-described oscillator controller 3 will now be discussed below. FIG. 5 shows the structure of an oscillator controller according to a first embodiment of the present invention. This oscillator controller 3-1 has an excitation circuit 31, a start-up voltage monitor 32*a*, a light amount monitor 32*b*, and a bias voltage selector 32*c*.

The oscillator controller 3-1 comprises discrete components which are connected as follows. In the excitation circuit 31, the collector of a transistor Tr is wired to a voltage Vin, together with one end of a resistor R1. The base is connected to the other end of the resistor R1, the anode of a diode D1, one end of capacitors C1 and C31. The cathode of a varactor diode Cd1 is connected to one end of a resistor R3, the other end of capacitor C31 and one end of capacitor C3. The emitter is connected to the other end of the capacitor C1, one end of a capacitor C2, and one end of a resistor R2. The cathode of the diode D1 is grounded, and so are the other ends of the capacitor C2 and resistor R2. The other end of the resistor R3 is connected to three switches SW1 to SW3 in the bias voltage selector 32*c*. The other end of the capacitor C3 is wired to the anode of the varactor diode Cd1, one end of resistors R4 and R5, and one end of a coil L. The other end of the coil L is grounded, and so is the other end of the resistor R4. The coil L is wound around a rubidium lamp Lp.

In the start-up voltage monitor 32*a*, the other end of the resistor R5 is connected to one end of a capacitor C4, the other end of which is connected the cathode of a diode D2 and the anode of a diode D3. The cathode of the diode D3 is connected to one end of a capacitor C5 and one input(+) of a comparator Comp1. Connected to the ground(+) are the anode of the diode D2 and the other end of the capacitor C5. The other input terminal(−) of the comparator Comp1 is connected to resistors R6 and R7. The other end of the resistor R7 is grounded, while the other end of the resistor R6 is connected to the voltage Va. The output terminal of the comparator Comp1 is connected to the inputs of a NOR gate IC1, EOR gate IC2, and AND gate IC3 in the bias voltage selector 32*c*.

In the light amount monitor 32*b*, a comparator Comp2 receives, at one of its input terminal(+), the resonance detection signal from the preamplifier 33*d* (FIG. 4), while its other input(−) is connected to one end of resistors R5 and R9. The other end of the resistor R9 is grounded. The other end of the resistor R8 is conneted to the voltage Va. The output of the comparator Comp 2 is connected to the remaining inputs of the NOR gate IC1, EOR gate IC2, and AND gate IC3. The outputs of those gates IC1, IC2, IC3 are wired to the control inputs of the switches SW1, SW2, and SW3, respectively. Three different bias voltages Vc1, Vc2, and Vc3 are available at the switches SW1 to SW3, one of which will be supplied to the excitation circuit 31 via the resistor R3 when its corresponding switch is activated.

Referring again to the excitation circuit 31, the transistor Tr, capacitors C1, C2, and coil L form an LC-tuned Colpitts oscillator, whose oscillation frequency f1 is approximately given by:

$$f1 \approx 1/2\pi\sqrt{L \cdot C1 \cdot C2/C1+C2}$$

The capacitor C3 is inserted for the purpose of DC decoupling between the collector and base of the transistor Tr. This capacitor C3 also prevents the transistor Tr from undesired oscillation due to a signal feedback through a collector-base capacitance, which could occur when the transistor Tr has a large gain. The capacitor C3, together with other capacitors related to the oscillation, will affect the operating characteristics of the rubidium lamp Lp.

The oscillator controller 3-1 of FIG. 5 is configured as above, and it operates as follows. When the excitation circuit 31 starts to oscillate, a DC voltage is developed across the capacitor C5 in the start-up voltage monitor 32*a* as a result of rectification by the diodes D2 and D3. While its initial output level is low, the comparator Comp1 outputs a high-level signal when the excitation circuit 31 starts up and a sufficient level of DC voltage appears at the comparator input.

The light amount monitor 32*b*, on the other hand, monitors the voltage level of the resonance detection signal supplied from the preamplifier 33*d* (FIG. 3). More specifically, the comparator Comp2 outputs a low-level signal while the rubidium lamp Lp is out, and a high-level signal when it lights up. This signal is referred to as the light amount monitoring signal, and it is applied to the logic gates IC1 to IC3 in the bias voltage selector 32*c*, together with the voltage monitoring signal. The outputs of those logic gates IC1 to IC3 are used to control the switches SW1 to SW3.

As already mentioned, the excitation circuit 31 employs a varactor diode Cd1 in parallel with the capacitor C3 ("first capacitor"). This varactor diode Cd1 is reversely biased (i.e., the cathode voltage is higher than the anode voltage, and hence no current flow), so that its junction capacitance will be varied in accordance with that bias voltage. According to the present embodiment, the bias voltage applied to the varactor diode Cd1 is either of Vc1, Vc2, and Vc3, depending on which switches SW1 to SW3 is currently activated.

FIG. 6 shows a bias voltage selection table T that defines the relationships between the states of the voltage monitoring signal, light amount monitoring signal, switches SW1 to SW3, and bias voltage. This table T assumes three conditions described below.

First, when both the voltage monitoring signal and light amount monitoring signal are low ("L"), it means that the rubidium lamp Lp has not yet started up (i.e., the excitation circuit 31 is not oscillating). At this "pre-start-up" stage, the bias voltage selector 32*c* activates the first switch SW1 selectively, thus enabling the first bias voltage Vc1 to be supplied to the excitation circuit 31.

Second, when the voltage monitoring signal is high ("H"), but the light amount monitoring signal is still low, it means that the rubidium lamp Lp has not yet lighted up, although the excitation circuit 31 is oscillating. At this "pre-light-up" stage, the bias voltage selector 32*c* activates the second switch SW2 selectively, thus enabling the second bias voltage Vc2 to be supplied to the excitation circuit 31.

Third, when both the voltage monitoring signal and light amount monitoring signal are high, it means that the rubidium lamp Lp stays lighted. At this "after-light-up" stage, the bias voltage selector 32*c* activates the third switch SW3 selectively, thus enabling the third bias voltage Vc3 to be supplied to the excitation circuit 31.

The bias voltage, when applied to the varactor diode Cd1, will produce a specific amount of capacitance, which adds to the fixed capacitance of the capacitor C3 connected in parallel therewith. The three bias voltages Vc1 to Vc3 are previously determined to provide an appropriate combined capacitance value of C3 and Cd1, so that the rubidium lamp Lp will operate on an optimal condition at each individual stage of "pre-start-up," "pre-light-up," and "after-light-up."

The above-described structure permits the excitation circuit 31 to operate with its circuit parameters that are optimized in accordance with the current state of the rubidium lamp Lp, which is identified by monitoring the signals supplied from the start-up voltage monitor 32*a* and light amount monitor 32*b*. With this feature of the present invention, the atomic oscillator 1 can maintain its reliability for an extended period. Unlike the conventional circuits discussed earlier, the proposed oscillator controller design is suitable for size reduction of rubidium oscillators since it can be implemented by simply adding a few logic gates and discrete devices, without the use of bulky components.

Figure 7:
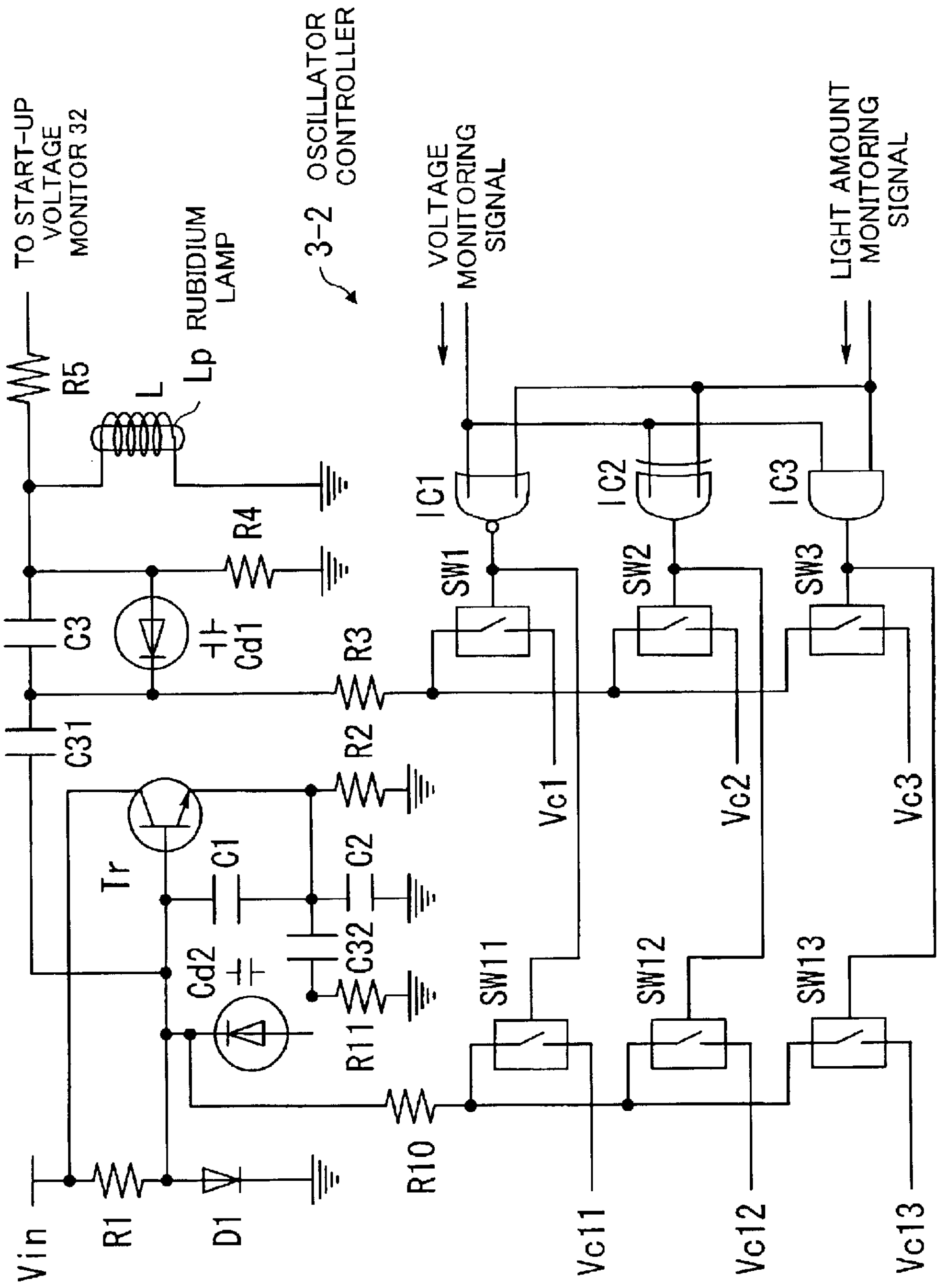
FIG. 7 shows the structure of an oscillator controller according to a second embodiment of the present invention.

Referring now to the schematic diagram of FIG. 7, an oscillator controller according to a second embodiment of the present invention will be described below. The illustrated oscillator controller 3-2 is different from the first embodiment in that another varactor diode and its bias voltage circuit are added. It actually has a start-up voltage monitor 32*a* and light amount monitor 32*b* as in the first embodiment, although FIG. 7 omits them for simplicity purposes.

The components of the oscillator controller 3-2 are connected as follows. In the excitation circuit 31, the collector of a transistor Tr is wired to a voltage Vin, together with one end of a resistor R1. The base is connected to the other end of the resistor R1, the anode of a diode D1, one end of capacitors C1 and C31, the cathode of the varactor diode Cd2 and one end of the register R10. One end of a resistor R3 is connected to the cathode of the varactor diode Cd1, the other end of the capacitor C31 and one end of the capacitor C3. The emitter is connected to the other end of the capacitor C1, one end of a resistor R2, one end of a capacitor C2 and one end of a capacitor C32. The anode of the second varactor diode Cd2 is connected to one end of a resister R11 and the other end of a capacitor C32. The cathode of the diode D1 is grounded, and so are the other end of the capacitor C2 and resistors R2 and R11. The other end of capacitor C3 is connected to the anode of the first varactor diode Cd1, one end of resistors R4 and R5, and one end of a coil L. The other end of the coil L is grounded, and so is the other end of the resistor R4. The coil L is wound around a rubidium lamp Lp. The other end of the resistor R5 is connected to the start-up voltage monitor 32*a* (not shown in FIG. 7).

The circuit parameter optimizer 32 produces and sends a voltage monitoring signal to a NOR gate IC1, an EOR gate IC2, and an AND gate IC3. Connected to the remaining inputs of those logic gates is a light amount monitoring signal supplied from the light amount monitor 32*b* (not shown in FIG. 7). The output of the NOR gate IC1 is connected to the control inputs of switches SW1 and SW11. The output of the EOR gate IC2 is connected to the control inputs of switches SW2 and SW12. The output of the AND gate IC3 is connected to the control inputs of switches SW3 and SW13. Three different bias voltages Vc1 to Vc3 are available at the switches SW1 to SW3, respectively, one of which will be supplied to the excitation circuit 31 via the resistor R3 when its corresponding switch is activated. In addition, three more bias voltages Vc11 to Vc13 are available at the other set of switches SW11 to SW13, respectively, one of which will be supplied to the excitation circuit 31 via the resistor R10 when its corresponding switch is activated.

As seen from the above explanation, the oscillator controller 3-2 differs from the foregoing oscillator controller 3-1 (FIG. 5) in that a second varactor diode Cd2 is employed in parallel with the capacitor C1 ("second capacitor") that is one of the key components for determining the oscillation frequency, and that another set of switches SW11 to SW13 and bias voltages Vc11 to Vc13 to control the second varactor diode Cd2. The excitation circuit 31 as such is expected to operate more reliably with the increased number of variable circuit parameters that can be tuned individually.

Figure 8:
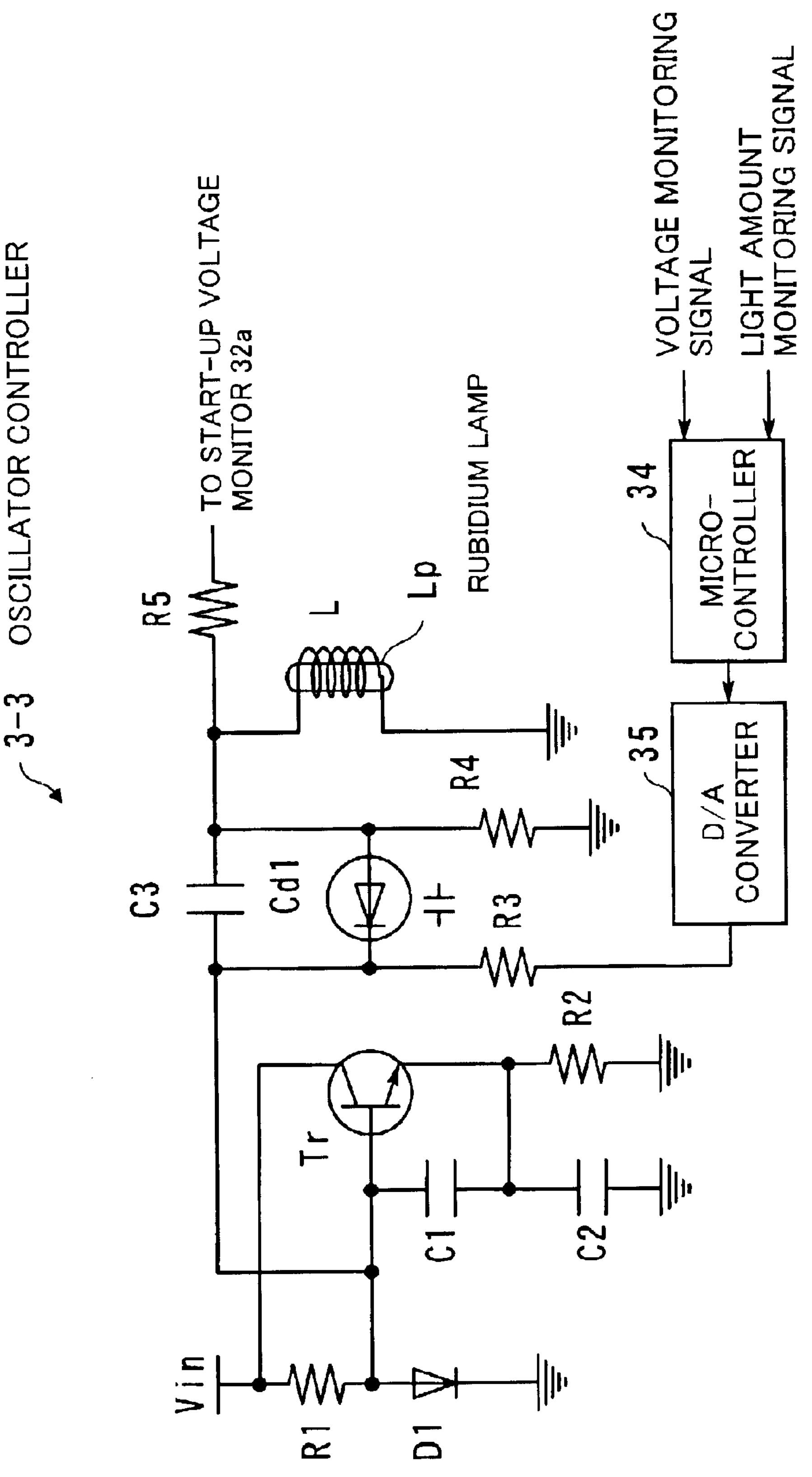
FIG. 8 shows the structure of an oscillator controller according to a third embodiment of the present invention.

Referring next to the schematic diagram of FIG. 8, we will describe an oscillator controller according to a third embodiment of the present invention. While it looks similar to the first embodiment, the illustrated oscillator controller 3-3 employs an intelligent processing device, instead of logic gates and analog switches used in the first embodiment. The oscillator controller 3-3 actually has a start-up voltage monitor 32_a_ and light amount monitor 32_b_ as in the first embodiment, although FIG. 8 omits them for simplicity purposes. About other discrete devices and their connections, refer to the earlier section that describes the first embodiment in FIG. 5.

According to the third embodiment, the oscillator controller 3-3 has a microcontroller 34 and a digital-to-analog (D/A) converter 35. The microcontroller 34 is programmed so that it will calculate an optimal bias voltage level for the circuit, adaptively to each state of the rubidium lamp Lp (i.e., "pre-start-up," "pre-light-up," "after-light-up"), based on the voltage monitoring signal and light amount monitoring signal. The microcontroller 34 outputs the result as a digital value to the D/A converter 35, thus yielding a DC bias voltage for the varactor diode Cd1. In this way, the third embodiment provides the same feature as the first embodiment does.

Figure 9:
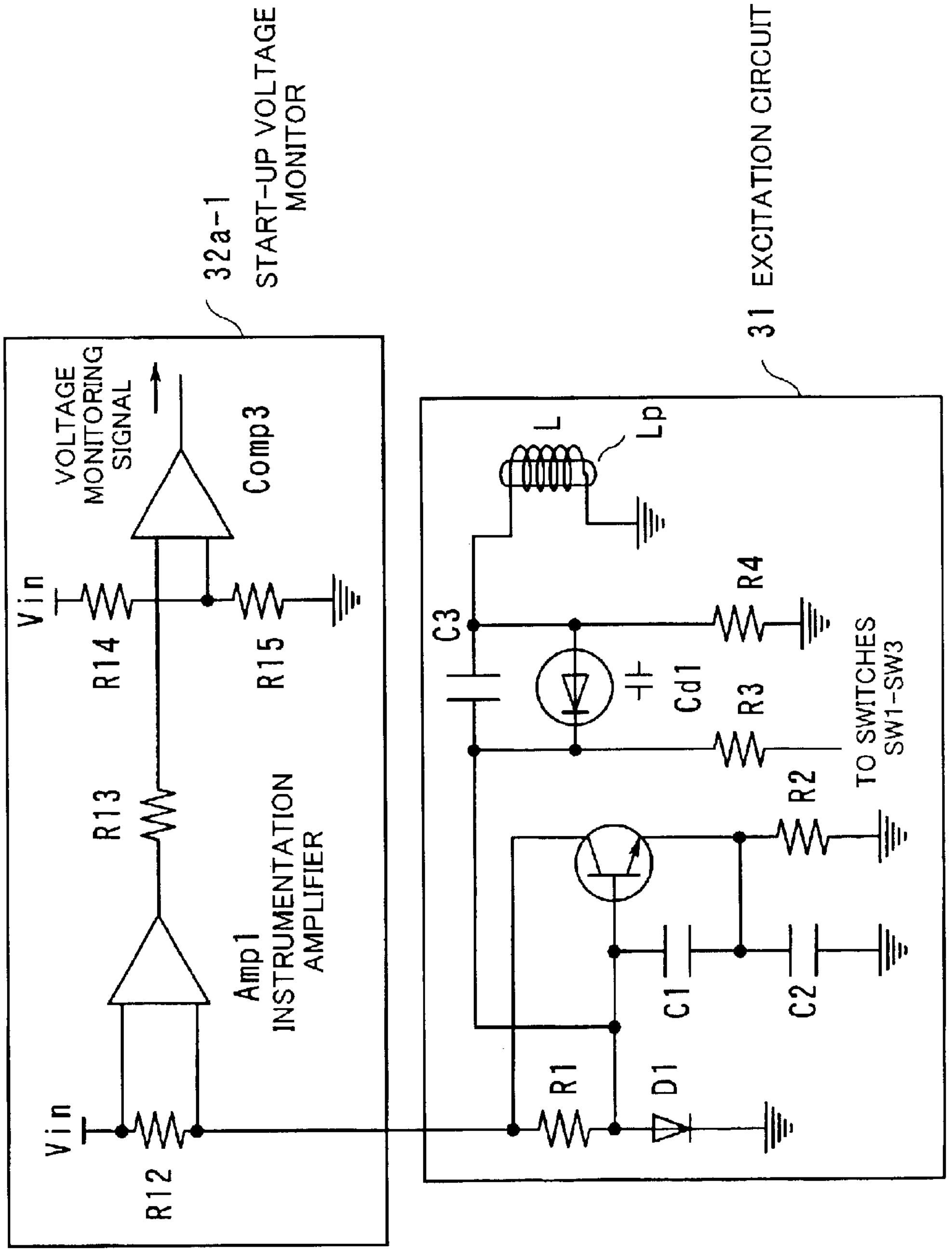
FIG. 9 shows another version of the start-up voltage monitor in FIG. 5.
Figure 10:
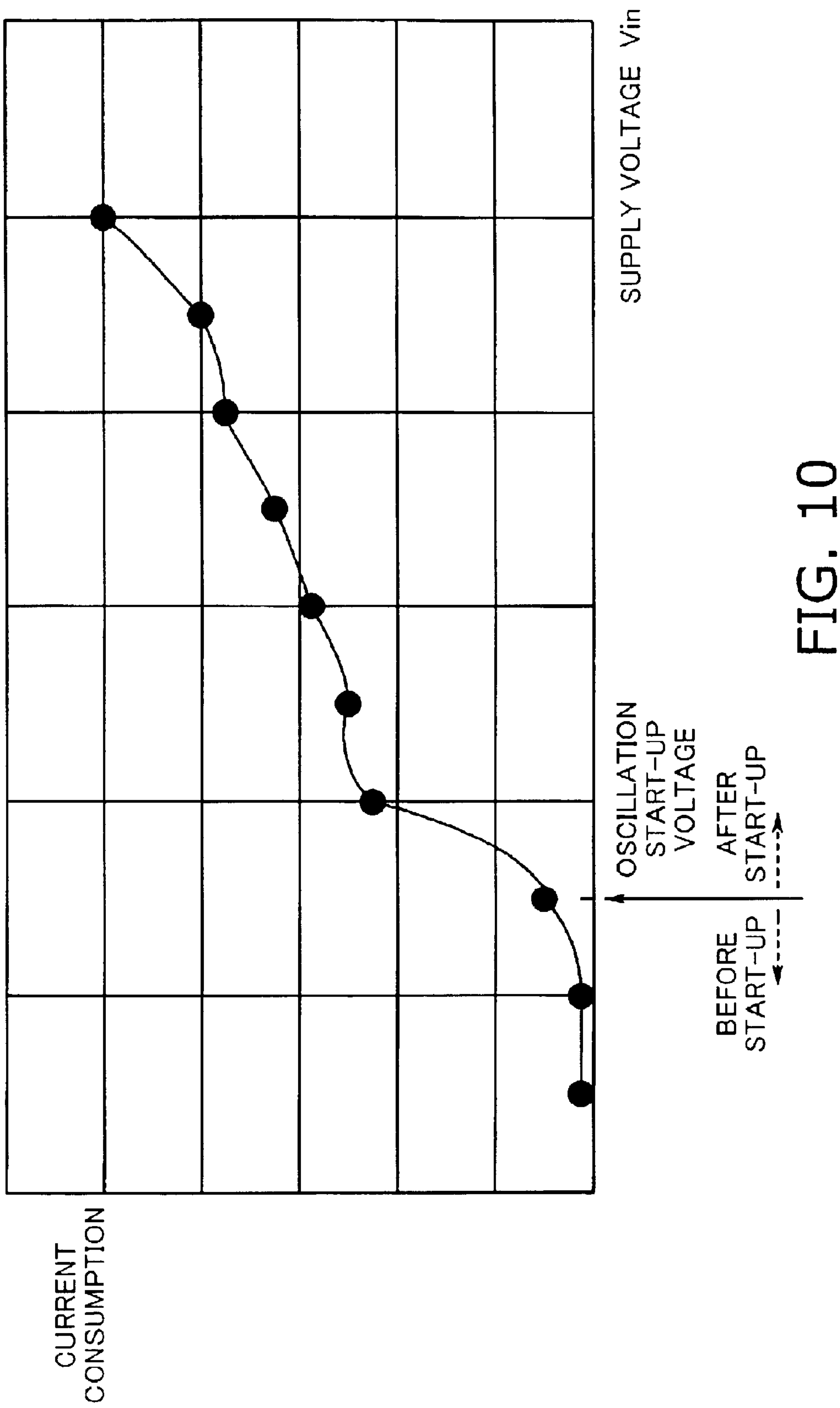
FIG. 10 shows the relationship between current consumption of an excitation circuit and its supply voltage.

Referring next to FIGS. 9 and 10, a variation of the start-up voltage monitor 32_a_ will be described below. FIG. 9 shows the structure of a start-up voltage monitor 32_a_-1, another version of the start-up voltage monitor 32_a_ explained earlier, which operates in combination with the excitation circuit 31.

The start-up voltage monitor 32_a_-1 has a resistor R12 inserted in series to the Vin line that feeds power to the excitation circuit 31. The both ends of this resistor R12 are connected to the differential inputs of an instrumentation amplifier Amp1. The output of the instrumentation amplifier Amp1 is supplied to one input of a comparator Comp3 through a series resistor R13. The other input of the comparator Comp3 is connected to the junction point of two resistors R14 and R15 that divide the voltage Vin with respect to the ground.

FIG. 10 shows the relationship between current consumption and supply voltage in the excitation circuit 31. The vertical axis of this graph represents the current consumption, and the horizontal axis represents the supply voltage Vin. As seen, the current consumption exhibits an abrupt increase just after the supply voltage Vin crosses the oscillation start-up voltage. This change in the supply current is sensed by the instrument amplifier Amp1, which serves as a current detector, and directed to the comparator Comp3 for comparison with the threshold voltage defined by the resistors R14 and R15. With the appropriate threshold to detect the oscillation start-up voltage, the comparator will indicate whether the excitation circuit 31 has started up or not. That is, the modified start-up voltage monitor 32_a_-1 is functionally equivalent to the original start-up voltage monitor 32_a_.

Figure 11:
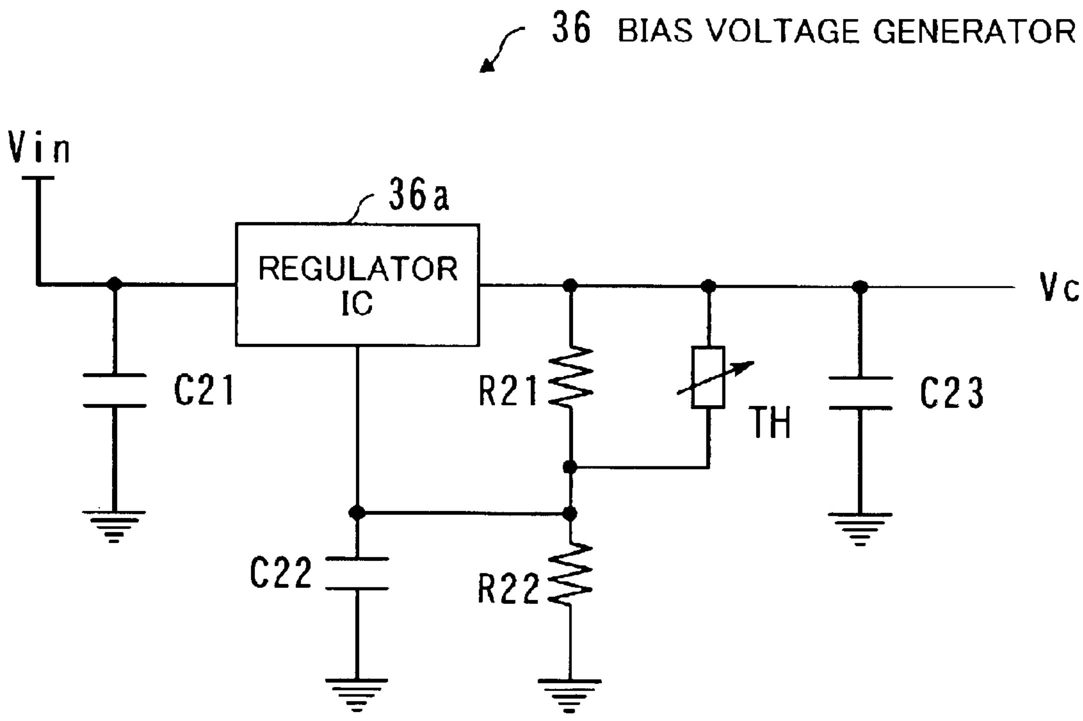
FIG. 11 shows the structure of a bias voltage generator.
Figure 12:
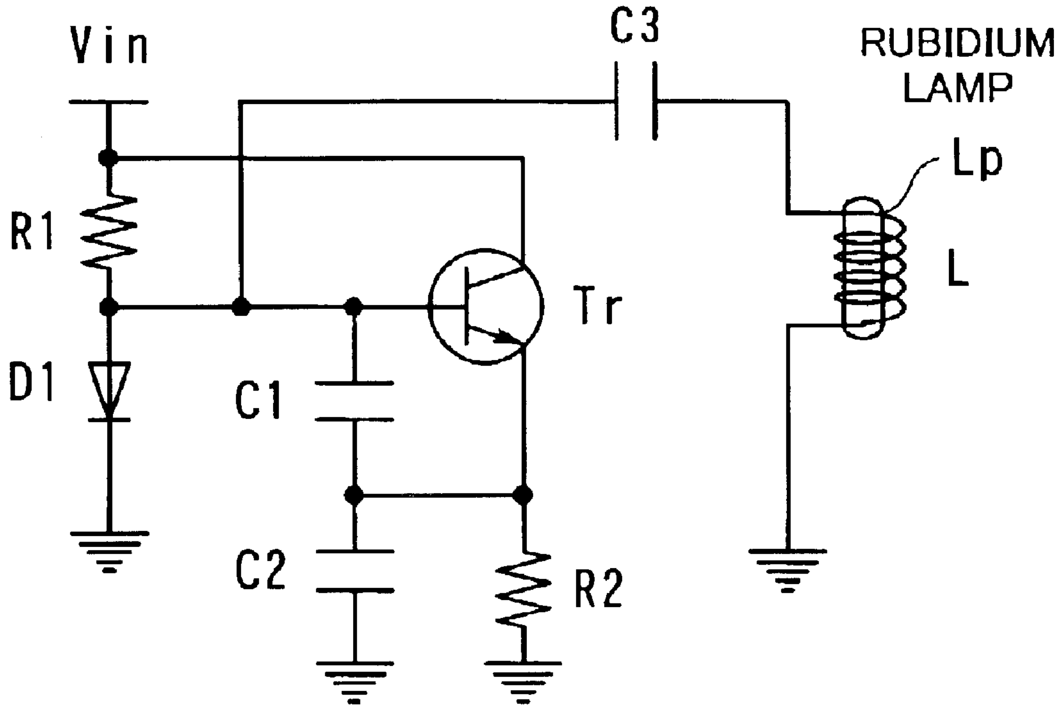
FIG. 12 PRIOR ART
FIG. 12 shows the structure of a conventional excitation circuit to drive a discharge lamp.
Figure 13:
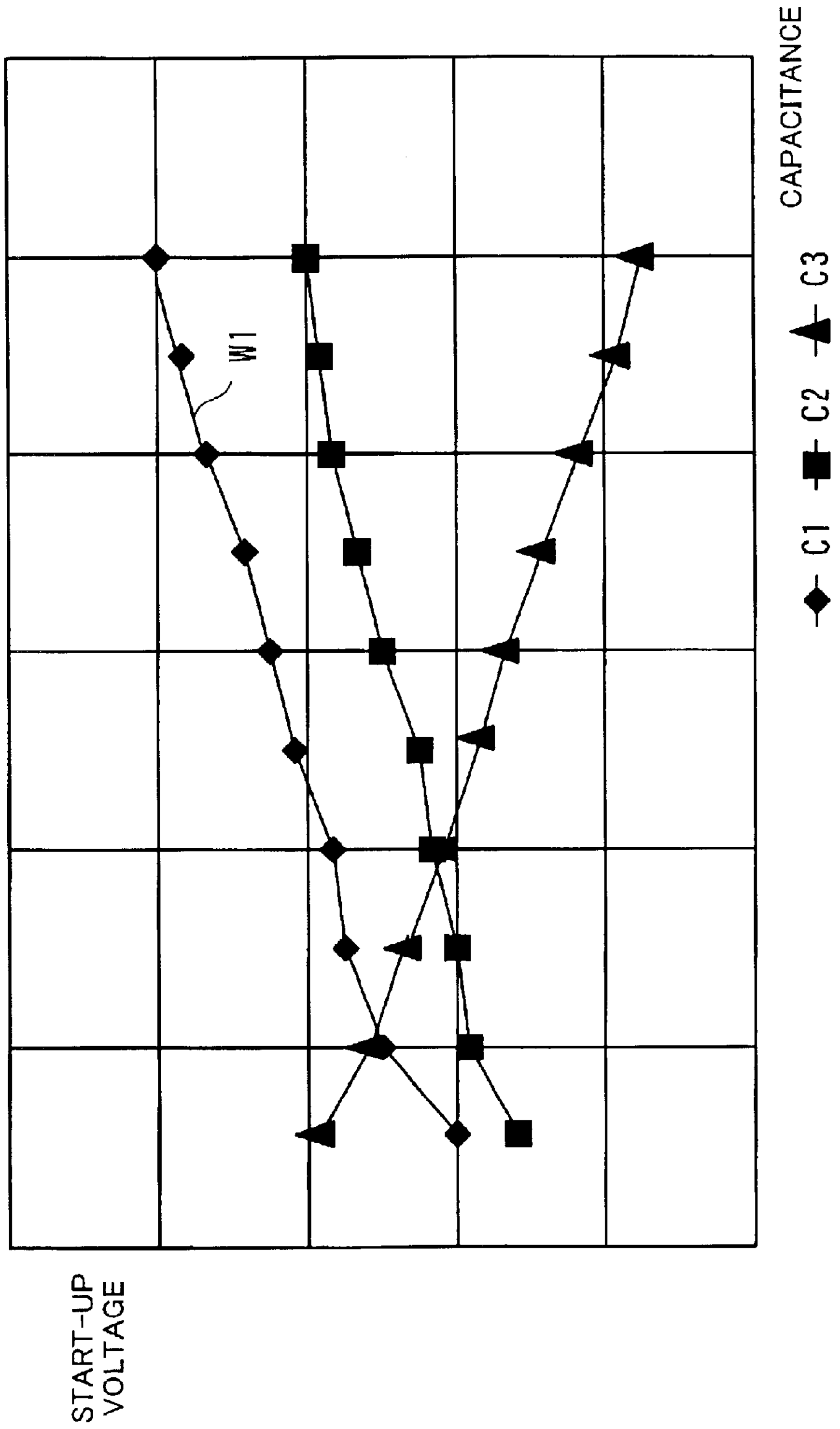
FIG. 13 PRIOR ART
FIG. 13 shows the relationship between the start-up voltage of a rubidium lamp and the values of capacitors used in an excitation circuit.
Figure 14:
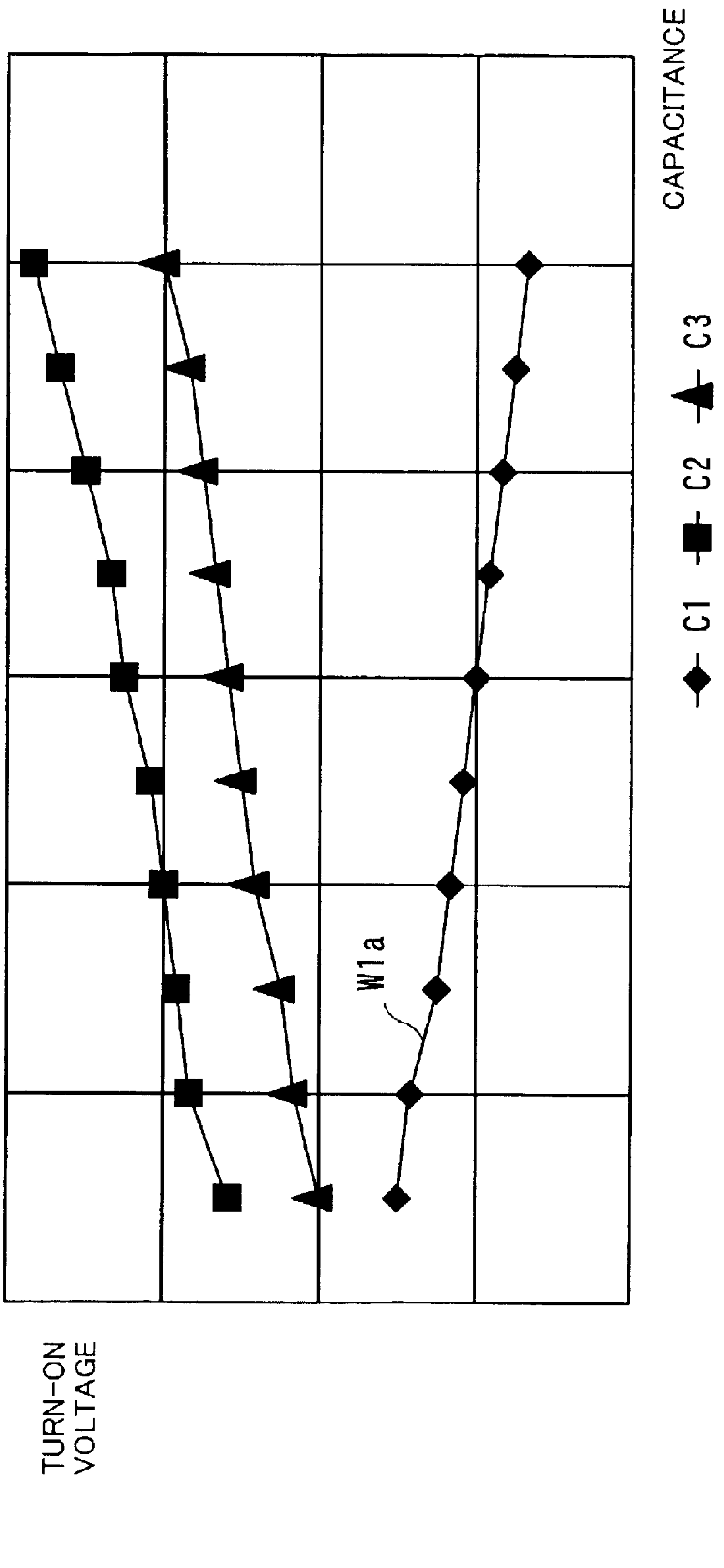
FIG. 14 PRIOR ART
FIG. 14 shows the relationship between the turn-on voltage of a rubidium lamp and the values of capacitors used in an excitation circuit.
Figure 15:
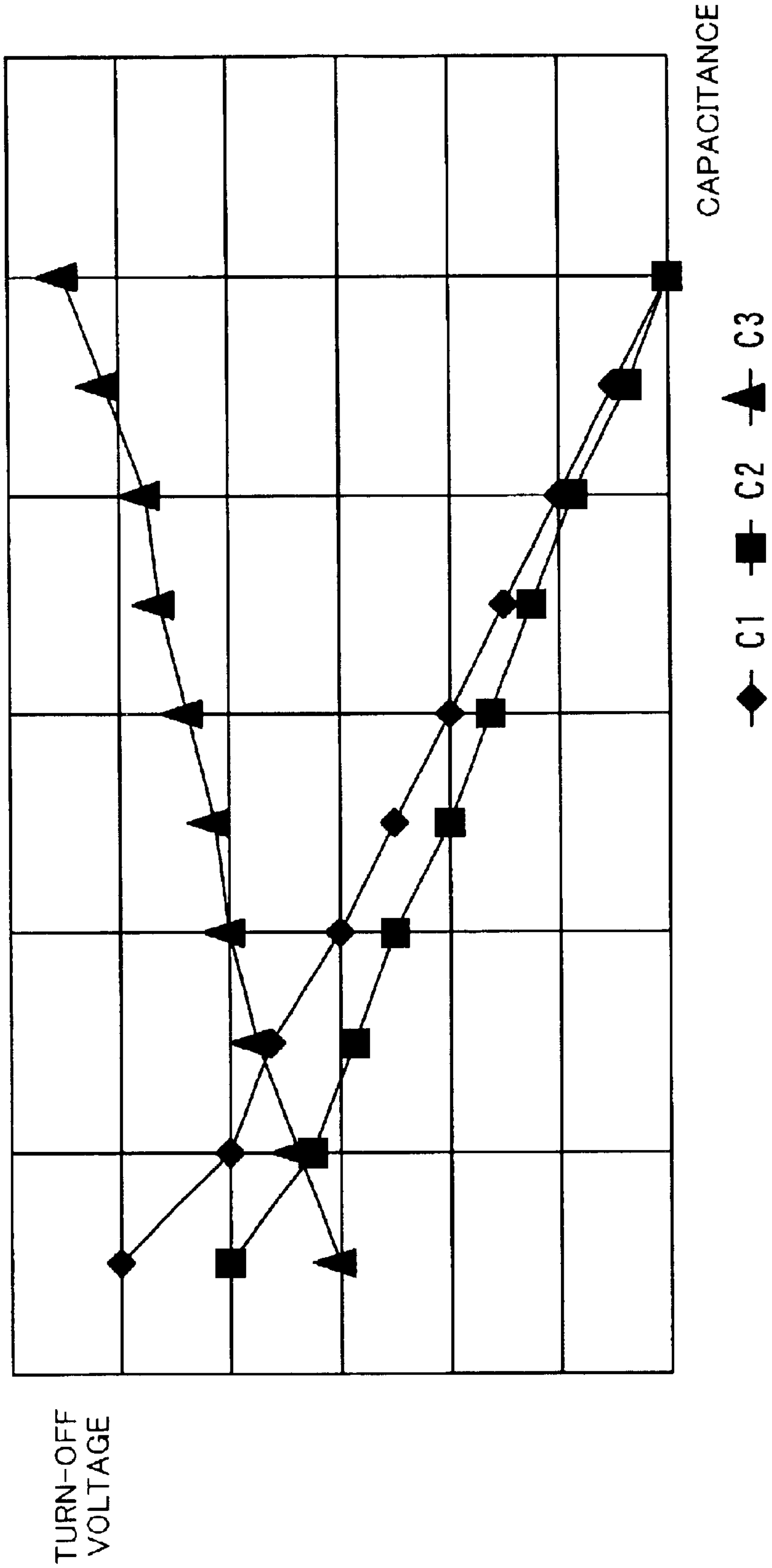
FIG. 15 PRIOR ART
FIG. 15 shows the relationship between the turn-off voltage of a rubidium lamp and the values of capacitors used in an excitation circuit.

Referring lastly to FIG. 11, a bias voltage generator will be described. FIG. 11 is a schematic diagram of a bias voltage generator 36, whose components and their connections are as follows. The bias voltage generator 36 employs a regulator 36_a_, whose input is connected to the voltage Vin with a bypass capacitor C21. The other end of the capacitor C21 is grounded. The output of the regulator 36_a_ is connected to one end of a resistor R21, one end of a temperature sensing device (e.g., thermistor) TH, and one end of a capacitor C23. The ground terminal of the regulator 36_a_ is connected to one end of a capacitor C22, the other end of the resistor R21, one end of a resistor R22, and the other end of the temperature sensing device TH. The other ends of the capacitors C22 and C23 are grounded, and so is the other end of the resistor R22.

It should be noted that the optimal circuit parameters of the excitation circuit 31 may vary with its ambient temperature. To yield a better performance, the bias voltages have to be varied according to the temperature changes. This adaptiveness is accomplished by employing a temperature sensing device in the bias voltage generator 36, as shown in FIG. 11. As a result, a varactor diode Cd operates with a temperature-compensated bias voltage Vc, thus being able to vary the circuit parameters more accurately. Basically, the proposed oscillator controller is equipped with such a bias voltage generator 36 for each bias voltage.

The above discussion will now be summarized as follows. According to the present invention, the proposed oscillator controller is designed to optimize some circuit parameters in its excitation circuit, depending on the current state of the rubidium lamp (e.g., either of "pre-start-up," "pre-light-up," and "after-light-up"). This feature makes more reliable use of rubidium lamps possible, ensuring their proper operation for an extended period.

To implement the above feature of the present invention, the proposed oscillator controller, as well as the proposed atomic oscillator, employs a voltage monitor and a light amount monitor to identify whether the excitation circuit has started up, and whether the lamp has lighted up. The outputs of those monitor circuits are used to determine how high bias voltage to apply to the excitation circuit. In this way, the proposed oscillator controller and atomic oscillator optimize key circuit parameters in its excitation circuit, according to the current state of the discharge lamp.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An oscillator controller for use in an atomic oscillator, comprising:

(a) an excitation circuit having a discharge lamp, which produces a light beam by energizing said discharge lamp, the light beam being for use in pumping atoms; and (b) a circuit parameter optimizer which controls at least one circuit parameter of said excitation circuit for optimal operation thereof, comprising:

a start-up voltage monitor which detects whether a start-up voltage of said excitation circuit is reached, thus producing a voltage monitoring signal, a light amount monitor which receives a resonance detection signal to check the amount of light before and after the rubidium lamp lights up, thus producing a light amount monitoring signal, and a bias voltage selector which selects a bias voltage for use in said excitation circuit, based on the voltage monitoring signal and light amount monitoring signal.

2. The oscillator controller according to claim 1, wherein:

said excitation circuit comprises a varactor diode and a capacitor connected in parallel with each other, said capacitor being dominant in determining operating characteristics of the discharge lamp; and said circuit parameter optimizer optimizes the circuit parameter by applying the selected bias voltage to said varactor diode to vary combined capacitance of said capacitor and varactor diode.

3. The oscillator controller according to claim 1, wherein said excitation circuit includes an LC-tuned oscillator which comprises:

a transistor;

a first capacitor for decoupling between base DC voltage and collector DC voltage of said transistor;

a second capacitor which governs oscillation frequency of said LC-tuned oscillator; and a varactor diode disposed in parallel with said first capacitor or said second capacitor to form a combined capacitance thereof, and wherein said circuit parameter optimizer optimizes the circuit parameter by applying the selected bias voltage to said varactor diode to adjust the combined capacitance to an intended value.

4. The oscillator controller according to claim 1, wherein said circuit parameter optimizer comprises:

a microcontroller which is programmed to output a digital value representing the bias voltage, based on the voltage monitoring signal and light amount monitoring signal; and a digital-to-analog converter which converts the digital value to an analog signal for use as the selected bias voltage in said excitation circuit.

5. The oscillator controller according to claim 1, wherein said start-up voltage monitor recognizes the start-up voltage of said excitation circuit by observing a voltage that is obtained by rectifying an oscillation signal produced in said excitation circuit.

6. The oscillator controller according to claim 1, wherein:

said start-up voltage monitor comprises a current sensor to measure current consumption of said excitation circuit; and said start-up voltage monitor recognizes the start-up voltage of said excitation circuit by monitoring the current consumption indicated by said current sensor.

7. The oscillator controller according to claim 1, further comprising a bias voltage generator which produces the bias voltage, wherein said bias voltage generator has a temperature sensing device to compensate for variations in ambient temperature.

8. An atomic oscillator whose resonance frequency derives from on atomic transitions, comprising:

(a) a voltage-controlled oscillator which produces an oscillation signal according to a given control voltage;

(b) a frequency synthesizer which produces microwaves from the oscillation signal by modulating the oscillation signal with a low-frequency signal and upconverting the oscillation signal with frequency synthesis techniques;

(c) an atomic resonator, comprising:

(c1) an excitation circuit having a discharge lamp, which produces a light beam by energizing said discharge lamp, the light beam being for use in pumping atoms, (c2) a circuit parameter optimizer which controls at least one circuit parameter of said excitation circuit for optimal operation thereof, comprising:

a start-up voltage monitor which detects whether a start-up voltage of said excitation circuit is reached, thus producing a voltage monitoring signal, a light amount monitor which receives a resonance detection signal to check the amount of light before and after the rubidium lamp lights up, thus producing a light amount monitoring signal, and a bias voltage selector which selects a bias voltage for use in said excitation circuit, based on the voltage monitoring signal and light amount monitoring signal, and (c3) a resonance detection unit which produces a resonance detection signal by detecting the amount of the light beam having passed through the atoms, the amount varying in accordance with the difference between the frequency of the microwaves and the resonance frequency of the atoms; and (d) a servo circuit which produces and supplies the low-frequency signal to said frequency synthesizer, as well as produces the control voltage for said voltage-controlled oscillator by demodulating the resonance detection signal synchronously with the low-frequency signal.

9. The atomic oscillator according to claim 8, wherein:

said excitation circuit comprises a varactor diode and a capacitor connected in parallel with each other, said capacitor being dominant in determining operating characteristics of the discharge lamp; and said circuit parameter optimizer optimizes the circuit parameter by applying the selected bias voltage to said varactor diode to vary combined capacitance of said capacitor and varactor diode.

10. The atomic oscillator according to claim 8, wherein said excitation circuit includes an LC-tuned oscillator which comprises:

a transistor;

a first capacitor for decoupling between base DC voltage and collector DC voltage of said transistor;

a second capacitor which governs oscillation frequency of said LC-tuned oscillator; and a varactor diode disposed in parallel with said first capacitor or said second capacitor to form a combined capacitance thereof, and wherein said circuit parameter optimizer optimizes the circuit parameter by applying the selected bias voltage to said varactor diode to adjust the combined capacitance to an intended value.

11. The atomic oscillator according to claim 8, wherein said circuit parameter optimizer comprises:

a microcontroller which is programmed to output a digital value representing the bias voltage, based on the voltage monitoring signal and light amount monitoring signal; and a digital-to-analog converter which converts the digital value to an analog signal for use as the selected bias voltage in said excitation circuit.

12. The atomic oscillator according to claim 8, wherein said start-up voltage monitor recognizes the start-up voltage of said excitation circuit by observing a voltage that is obtained by rectifying an oscillation signal produced in said excitation circuit.

13. The atomic oscillator according to claim 8, wherein:

said start-up voltage monitor comprises a current sensor to measure current consumption of said excitation circuit; and said start-up voltage monitor recognizes the start-up voltage of said excitation circuit by monitoring the current consumption indicated by said current sensor.

14. The atomic oscillator according to claim 8, further comprising a bias voltage generator which produces the bias voltage, wherein said bias voltage generator has a temperature sensing device to compensate for variations in ambient temperature.

* * * * *